(12) United States Patent
Chang et al.

(10) Patent No.: US 12,345,751 B2
(45) Date of Patent: Jul. 1, 2025

(54) METHOD AND SYSTEM FOR TESTING PHASED ARRAY ANTENNA WITH INDEPENDENT SIGNAL CALIBRATION

(71) Applicant: TRON FUTURE TECH INC., Hsinchu (TW)

(72) Inventors: Li Han Chang, Hsinchu (TW); Yu-Jiu Wang, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 332 days.

(21) Appl. No.: 18/065,895

(22) Filed: Dec. 14, 2022

(65) Prior Publication Data

US 2023/0417811 A1  Dec. 28, 2023

Related U.S. Application Data

(60) Provisional application No. 63/368,669, filed on Jul. 18, 2022, provisional application No. 63/366,939, filed on Jun. 24, 2022.

(51) Int. Cl.
G01R 29/08 (2006.01)
(52) U.S. Cl.
CPC ..... *G01R 29/0878* (2013.01); *G01R 29/0871* (2013.01)
(58) Field of Classification Search
CPC .................. G01R 29/0878; G01R 29/0871
See application file for complete search history.

(56) References Cited

U.S. PATENT DOCUMENTS

| 5,005,019 A | 4/1991 | Zaghloul et al. |
| 11,005,190 B1 | 5/2021 | Lin et al. |
| 11,024,973 B2 | 6/2021 | Liu et al. |
| 2018/0091292 A1 | 3/2018 | Frye et al. |
| 2019/0260115 A1 | 8/2019 | Tehran et al. |
| 2020/0217879 A1* | 7/2020 | Kalatzis ............. G01R 29/0878 |

(Continued)

FOREIGN PATENT DOCUMENTS

| CN | 105990681 A | 10/2016 |
| CN | 108226584 A * | 6/2018 |
| CN | 110024221 A | 7/2019 |

(Continued)

OTHER PUBLICATIONS

English Machine Translation of CN 108226584 A (Year: 2018).*

(Continued)

*Primary Examiner* — David Z Huang
(74) *Attorney, Agent, or Firm* — WPAT, P.C.; Anthony King

(57) ABSTRACT

A method of testing an antenna array includes: receiving a probe needle set and a shielding structure, wherein the shielding structure includes an array of conductive pads. The antenna array includes a substrate and an array of antenna devices. Each of the antenna devices includes: a first and a second slits; a first and a second signal ports; a first and a second feed lines. The first and second feed lines have different line lengths; and a radiation element. The method further includes: causing the shielding structure to cover the radiation element of at least one antenna device; and causing the probe needle set to contact the first and second feed lines for testing the at least one antenna device.

20 Claims, 14 Drawing Sheets

(56) References Cited

U.S. PATENT DOCUMENTS

2020/0274241 A1     8/2020    Onaka et al.

FOREIGN PATENT DOCUMENTS

| | | |
|---|---|---|
| CN | 110137672 A | 8/2019 |
| CN | 111162381 A | 5/2020 |
| CN | 111900534 A | 11/2020 |
| CN | 112615148 A | 4/2021 |
| CN | 223993557 A | 10/2021 |
| CN | 111129731 B | 3/2022 |
| EP | 4290699 A1 | 12/2023 |
| JP | S63-135003 A | 6/1988 |
| JP | 06-140835 A | 5/1994 |
| JP | H06-140835 A | 5/1994 |
| JP | 06-232626 A | 8/1994 |
| JP | H06-232626 A | 8/1994 |
| JP | H11-031914 A | 2/1999 |
| JP | 2016-149687 A | 8/2016 |
| JP | 2019-535182 A | 12/2019 |
| JP | 2021-057705 A | 4/2021 |
| TW | I678844 B | 12/2019 |
| TW | I725594 B | 4/2021 |
| TW | 202125902 A | 7/2021 |
| WO | WO-2019116756 A1 * | 6/2019 ........... H01Q 1/2266 |
| WO | 2021/213182 A1 | 10/2021 |

OTHER PUBLICATIONS

First Office Action and search report issued Aug. 30, 2023 for corresponding Taiwan application 111148089.
English translation of the First Office Action and search report issued Aug. 30, 2023 for corresponding Taiwan application 111148089.
First Office Action issued Jul. 1, 2024 by Korean patent office corresponding to Korean Patent Application No. 10-2023-0074054 with translation.
English translation of the First Office Action issued Jul. 1, 2024 by Korean patent office corresponding to Korean Patent Application No. 10-2023-0074054 with translation.
English translation of 06-140835.
English translation of 06-232626.
English translation of 2021-057705.
English translation of 2016-149687.
Notice of Allowance for JP Application No. JP2023-101710 issued Oct. 29, 2024 by Japan IPO with translation.
First Office Action and search report issued Dec. 25, 2023 by Taiwan IPO with translation.
English abstract translation of the first Office Action and search report issued Dec. 25, 2023 by Taiwan IPO with translation.
U.S. Pat. No. 11,005,190 is the counterpart to TWI725594.
English abstract translation of TW202125902.
U.S. Pat. No. 11,024,973 is the counterpart to I678844.
First Office Action and search report for JP Application No. JP2023-101710 issued Jun. 25, 2024 by Japan IPO.
English translation of the First Office Action and search report for JP Application No. JP2023-101710 issued Jun. 25, 2024 by Japan IPO.
English translation of JPH06-140835.
English translation of JP2016-149687.
English translation of JP2021-057705.
English translation of JP2019-535182.
English translation of JPS63-135003.
Office Action issued by USPTO dated Feb. 4, 2025 for U.S. Appl. No. 18/065,957.
English abstract translation of CN111900534.
English abstract translation of CN111129731.
English abstract translation of CN112615148.
English abstract translation of CN111162381.

* cited by examiner

METHOD AND SYSTEM FOR TESTING PHASED ARRAY ANTENNA WITH INDEPENDENT SIGNAL CALIBRATION

PRIORITY CLAIM AND CROSS-REFERENCE

This application claims priority to U.S. provisional application Ser. No. 63/366,939 filed Jun. 24, 2022 and Ser. No. 63/368,669 filed Jul. 18, 2022, the disclosures of which are hereby incorporated by reference in its entirety.

BACKGROUND

In modern wireless communication technologies, satellite communications has attracted a lot of attention due to its advantages such as better signal coverage and high bandwidth as compared to conventional terrestrial communication technologies. It seems to be promising to incorporate the satellite communications into the popular cellular terrestrial communications to enhance the coverage and bandwidth of the wireless communication network. Further, the phased array antenna technology is usually adopted to work with the satellite communications for improve power efficiency in the relatively long transmission distance. However, the phase delays of the individual antenna devices in an antenna array should be well controlled with short delay and high accuracy, and thus the cost of the phased array antenna is still very high. Therefore, the commercialization of the satellite communication-based products is not satisfactory. As such, there is a need to develop a new phased array antenna and its testing method with an improved phase control design to lower its manufacturing cost.

SUMMARY

According to embodiments of the present disclosure, a method for testing an antenna array includes: receiving a probe needle set and a shielding structure, wherein the shielding structure includes an array of conductive pads. The antenna array includes a substrate and an array of antenna devices, and each of the antenna devices includes: a first slit and a second slit arranged in a first layer on a first surface of the substrate; a first signal port and a second signal port arranged in a second layer adjacent to the first layer; a first feed line and a second feed line arranged in the second layer and connected to the first signal port and the second signal port, respectively, wherein the first feed line and the second feed line have different line lengths; and a radiation element disposed in a third layer on a second surface of the substrate opposite to the first surface. The method further includes: causing the shielding structure to cover the radiation element of at least one antenna device; and causing the probe needle set to contact the first feed line and the second feed line for testing the at least one antenna device.

According to embodiments of the present disclosure, a probing system for testing at least one antenna device during a testing operation includes: a probe needle set; and a shielding structure including an array of conductive pads configured to cover the at least one antenna device. Each of the at least one antenna device includes: a substrate; a first ground plate arranged in a first layer on a first surface of the substrate; a first signal port and a second signal port arranged in a second layer adjacent to the first layer; a first feed line and a second feed line arranged in the second layer and connected to the first signal port and the second signal port, respectively, wherein the first feed line and the second feed line have different line lengths; a radiation element disposed in a third layer on a second surface of the substrate opposite to the first surface; and a first slit and a second slit arranged in the first layer and defined by the first ground plate. The shielding structure is configured to cover the radiation element of the at least one antenna device in the first testing operation. The probe needle set is configured to contact the first feed line and the second feed line in the first testing operation.

Through the arrangement of the proposed testing method and probing system for the phased array antenna, the phase calibration for each antenna device of the phased array antenna can be managed more easily and more accurately, and thus the RF transmitter and receiver can be manufactured with less cost, and operated with less power. The device reliability can also be improved.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
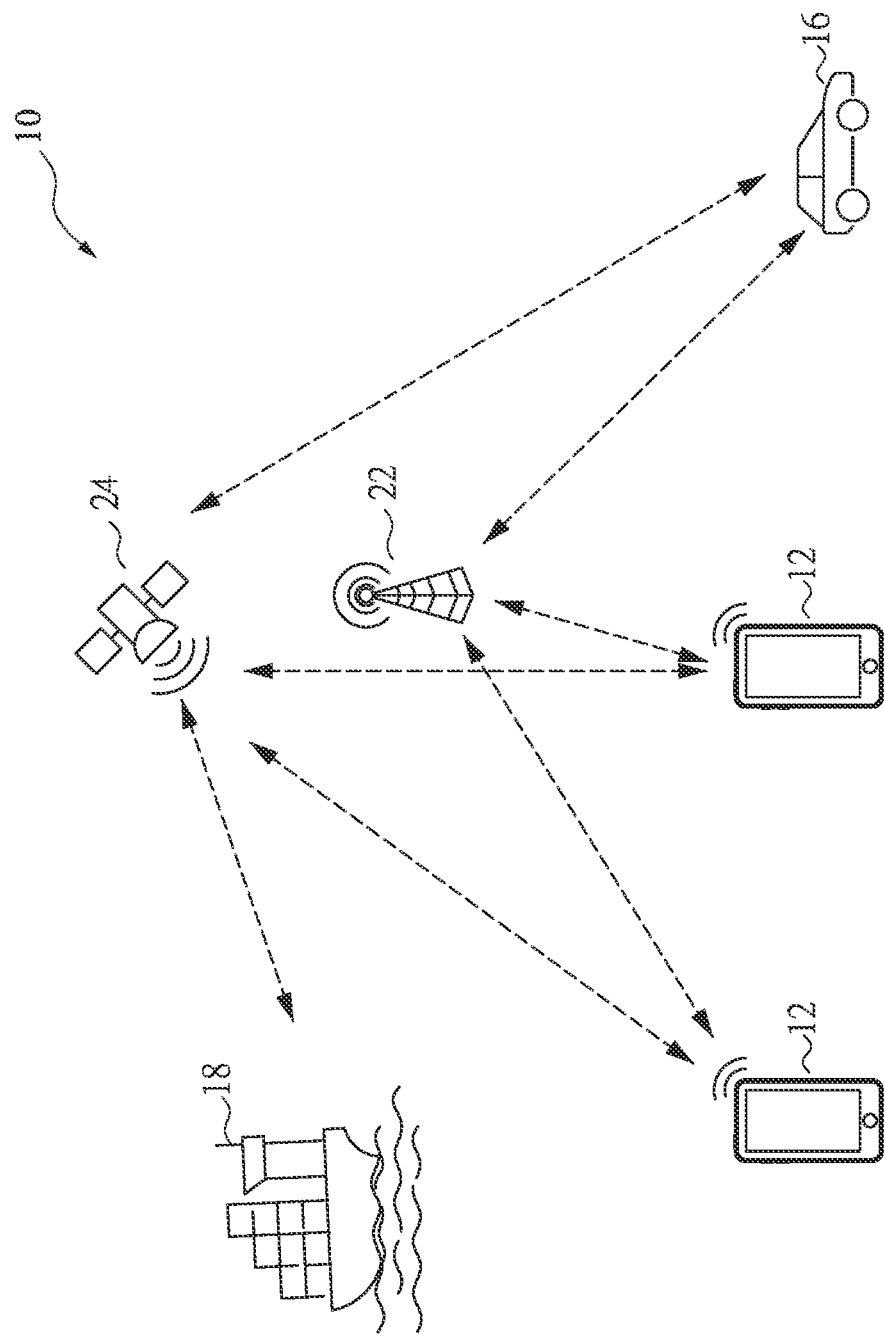
FIG. 1 is a schematic diagram showing a wireless communication system in a next-generation communication scenario, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "connected" may be construed as "electrically connected," and the term "coupled" may also be construed as "electrically coupled." "Connected" and "coupled" may also be used to indicate that two or more elements cooperate or interact with each other.

Embodiments of the present disclosure discusses a phased array antenna design suitable for terrestrial and non-terrestrial wireless communications, wherein the antenna structure includes two feed lines configured to provide two identical radio-frequency (RF) input signals with a properly managed phase delay for producing a circularly-polarized RF signals. The phase array antenna structure also includes a glass-based substrate on which the antenna components and the RF chip are formed. In some embodiments, the glass-based substrate is suitable for a large-scale antenna panel for its high planarity and low cost. Additionally, a pair of slits formed within and defined by the antenna ground are provided for coupling the RF signal between the radiation element of the antenna and the pair of slits. In some embodiments, there is substantially no conductive elements arranged in the glass-based substrate between the radiation element and the pair of slits of the antenna, thereby saving the cost of forming a through-glass via (TGV) for the antenna. The dual input RF signals for each antenna device are suitable for amplitude or phase calibration before the dual input RF signals are combined and coupled to the radiation element or after the output RF signals are received from the radiation element and prior to the RF signal combination. As a result, a highly accurate phased antenna array can be achieved with relatively simple design and lower manufacturing cost.

FIG. 1 is a schematic diagram showing a wireless communication system 10 in a next-generation communication scenario, in accordance with some embodiments of the present disclosure. The wireless communication system 10 includes one or more user devices 12, 14, 16 and 18, a terrestrial base station 22 and a non-terrestrial base station 24. In some embodiments, the user devices 12, 14 is carried and moved by a human, and are referred to as hand-held devices. In some embodiments, the user device 16 is a mobile device equipped in a vehicle moving on the land, such as a car, a train, or the like. In some embodiments, the user device 18 is a user device equipped in a ship moving in the sea, a river, or the like.

In some embodiments, the terrestrial base station 22 is an example of a base station deployed in a communication network, such as cellular communication network. The terrestrial base station 22 is configured to provide a communication network to the user devices 12, 14 and 16, in which the user devices 12, 14 and 16 can transmit or receive information between one another through the network established by a plurality of the terrestrial base stations 22. The terrestrial base station 22 may also be referred to as low-altitude platform. In some embodiments, the non-terrestrial based station 24 is an example of a communication satellite deployed in a communication satellite network. The non-terrestrial base station 24 is configured to provide a communication network to the user devices 12, 14, 16 and 18, in which the user devices 12, 14, 16 and 18 can transmit or receive information between one another via the satellite network. A plurality of the terrestrial base stations 22 and a plurality of the non-terrestrial base stations 24 can interlink to form a combined communication network, in which a global communication network can be realized to cover the user devices all over the world no matter where they are located, either in a low-altitude location, in a high-altitude location, or in any place not covered by the networks of the terrestrial base stations 22.

To achieve the goal of the global communication network exemplified by the wireless communication system 10, the user device 12, 14, 16 or 18 may need redesign to include a transmitter or a receiver with greater communication capability to communicate with the non-terrestrial base station 24 located in the high sky. Among the various transmitter or receiver designs, the phased array antenna technology is a promising solution to realize the beamforming technique, which can significantly increase the transmitter or receiving gain with greater reliability, and is suitable for satellite communication.

Figure 2A:
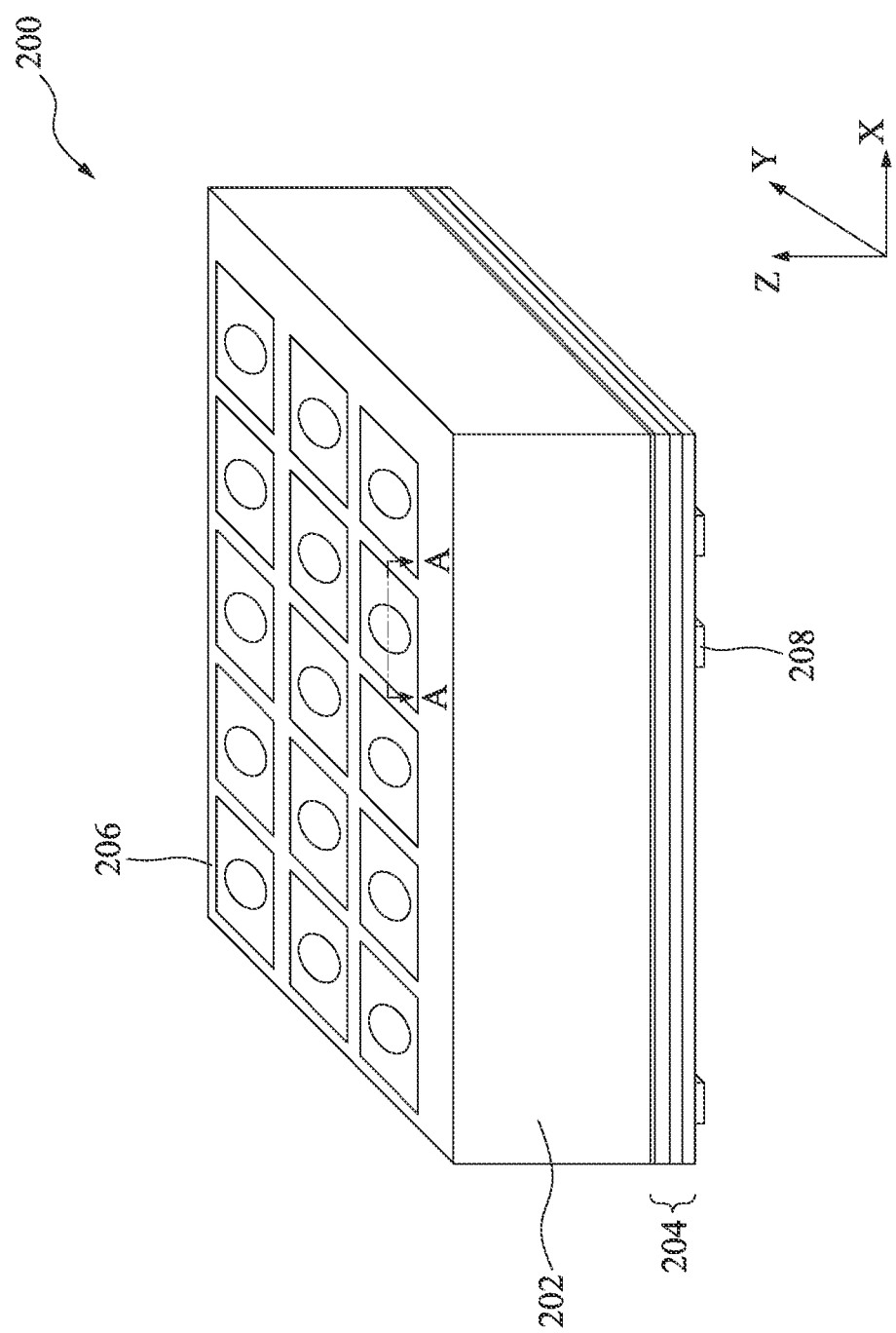
FIG. 2A is a schematic perspective view of an antenna array of a transmitter or receiver of a user device, in accordance with some embodiments.

FIG. 2A is a schematic perspective view of an antenna array of a transmitter or receiver 200 of the user device 12, 14, 16 or 18, in accordance with some embodiments. In some embodiments, the transmitter or receiver 200 is an RF transmitter or receiver. In some embodiments, the transmitter or receiver 200 serves as the transmitter or receiver of the terrestrial base station 22 or the non-terrestrial base station 24. In some embodiments, although not separately shown, the transmitter or receiver 200 includes a control circuit board and an RF circuit board configured to generate and control the RF signals to be transmitted by the transmitter 200, or configured to receive and control and RF signals to be received by the receiver 200. In some embodiments, each of the user devices 12, 14, 16, 18, the terrestrial base station and 22 the non-terrestrial base station 24 includes a transmitter 200 and a receiver 200 with different operating frequencies, e.g., operating at about 28 GHz and 18 GHz, respectively.

Referring to FIG. 2A, the transmitter or receiver 200 includes an antenna array formed of a plurality of antenna components, such as radiation elements 206, formed on a substrate 202 of an RF circuit board of the transmitter or receiver 200. In some embodiments, an example antenna device 200A includes a substrate 202 and an interconnect structure 204 arranged below the substrate 202. The interconnect structure 204 has a lower surface, and the substrate 202 has an upper surface. In some embodiments, an array of radiation elements 206 are formed on the upper surface of the substrate 202, while a plurality of RF chips 208 are arranged on the lower surface of the interconnect structure 204. The RF chips 208 may be interconnected through a plurality of conductive lines (not separately shown) on the lower surface of the interconnect structure 204. In some embodiments, the conductive lines may be encapsulated by an electrical insulating material or exposed through the surface of the interconnect structure 204. In some embodiments, each of the antenna devices 200A of the transmitter or receiver 100 includes a patch antenna structure, and each radiation element 206 includes a patch structure of the antenna device 200A, such as in a circular, elliptical or oval shape, and is referred to as the antenna patch 206 of the respective antenna device 200A.

Figure 2B:
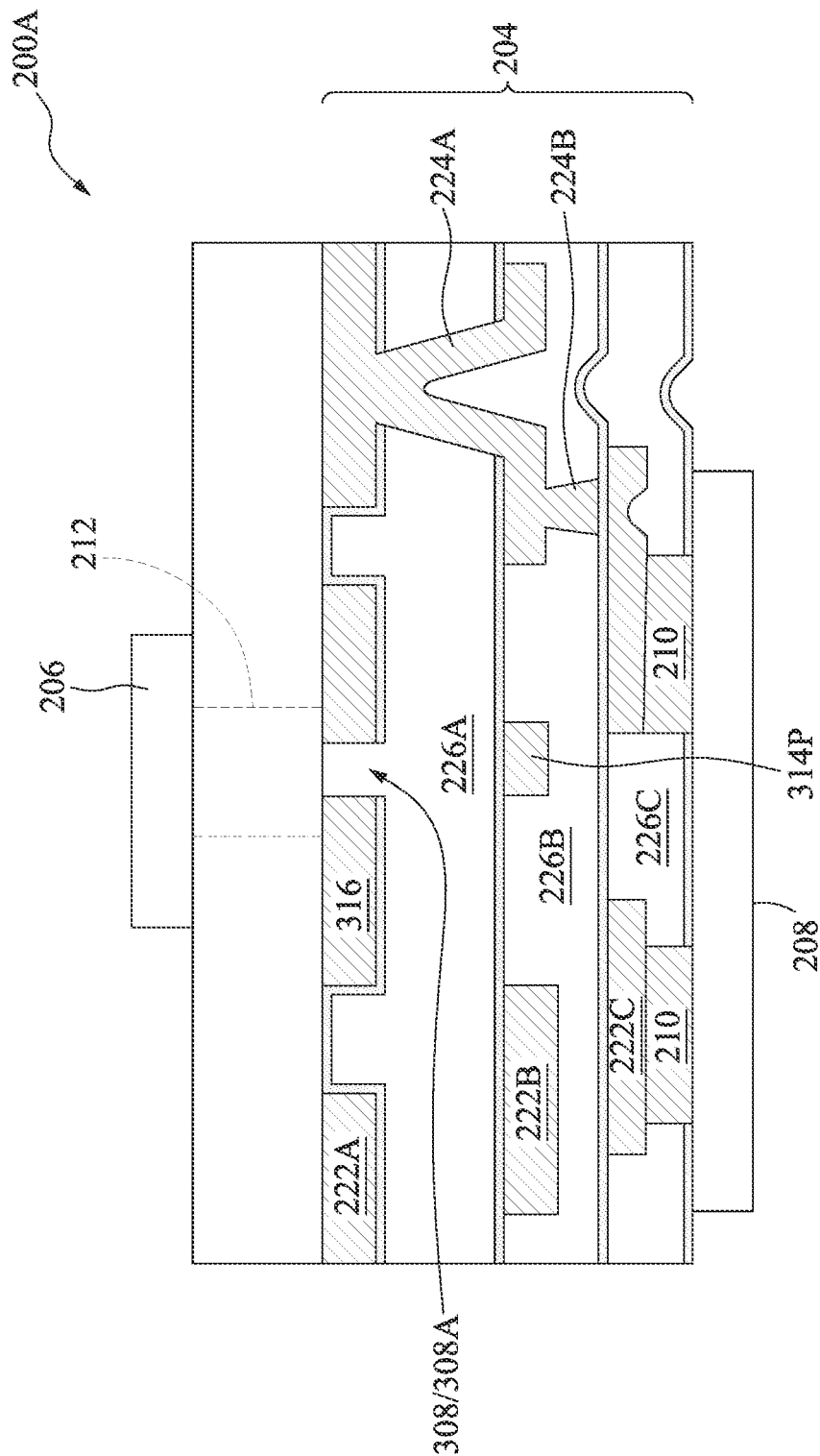
FIG. 2B is a schematic cross-sectional view of the transmitter or receiver shown in FIG. 2A, in accordance with some embodiments.

FIG. 2B is a schematic cross-sectional view of an antenna device 200A of the transmitter 200 or receiver 200 shown in FIG. 2A, in accordance with some embodiments. The cross-sectional view is taken along a sectional line AA of FIG. 2A. Referring to FIG. 2B, the substrate 202 is formed of a transparent material, such as glass, fused silica, silicon oxide, quartz, or the like. In some embodiments, the substrate 202 separates the antenna patches 206 from the electronic circuits of the interconnect structure 204 or RF chips 208. In some embodiments, RF signals are transmitted from the RF chip 208 formed on the lower side of the substrate 202, through the RF circuit formed in the interconnect structure 204, transmitted across a signal channel 212 in the transparent substrate 202, and coupled to the antenna patches 206 formed on the upper side of the substrate 202. In some embodiments, the antenna patch 206 includes additional patches on the circular or elliptical circumference of the antenna patch 206 to generate better field profile of an output RF signal. In some embodiments, the antenna patch 206 may be trimmed to include a truncated section or semicircle on the circular or elliptical circumference of the antenna patch 206 to seek better field profile of the output RF signal. The signal channel 212 may be formed of the transparent material of the substrate 202. In some embodiments, the thickness of the substrate 202 is determined based on the operation frequency of RF signal for the antenna devices 200A. Since the material of the substrate 202 is transparent to the RF signals, the substrate 202 may not need any conductive members within the projected area of the antenna patch 206 but still operable to electromagnetically connect the interconnect structure 204 to the antenna patches 206.

In some other embodiments, the substrate 202 is formed of non-transparent materials, such as elementary semiconductor material, e.g., bulk silicon. In some embodiments, the substrate 202 includes a conductive via formed in the signal channel 212 to electrically connect the RF circuit in the interconnect structure 204 to the antenna patch 206. As a result, the RF signals are transmitted from the RF chip 208 formed on the lower side of the substrate 202 and through the RF circuit formed in the interconnect structure 204, transmitted through the conductive via in the signal channel 212 in the non-transparent substrate 202, and reaches the antenna patches 206 formed on the upper side of the substrate 202. In some embodiments, an isolation film is deposited between the conductive via and the surrounding silicon material of the substrate 202 to provide better electrical insulation.

In some embodiments, the interconnect structure 204 is formed of a plurality of metallization layers in a stack. The metallization layers include patterned conductive lines or conductive vias, and these patterned conductive lines and vias are patterned or electrically interconnected to form interconnection paths and other parts of the antenna device 200A. For example, a first metallization layer formed on the lower surface of the substrate 202 includes first conductive lines or pads 222A. The first conductive lines or pads 222A may be patterned as ground plates, and the remaining spaces may be formed as slits or apertures for coupling RF signals to or from the antenna patches 206. In some other embodiments, the lines or pads 222A are formed as signal contacts for relaying the RF signals to conductive vias in the non-transparent substrate 202.

A second metallization layer is formed below the first metallization layer and includes first conductive vias, e.g., an example first conductive via 224A. Likewise, a third metallization layer is formed below the second metallization layer and includes second conductive lines or pads 222B, and a fourth metallization layer is formed below the third metallization layer and includes a plurality of second conductive vias, e.g., an example second conductive via 224B. The second conductive lines 222B may be patterned to form power lines or signal transmission lines. A fifth metallization layer is formed below the fourth metallization layer and includes third conductive lines 222C. The third conductive lines 222C may be patterned to form transmission lines for communicating the RF signals or control signals between the ports of the RF chips 208. In some embodiments, the conductive lines 222A, 222B, 222C are interconnected through the conductive vias 224A and 224B. In some embodiments, a plurality of conductive pads 210 are arranged below the sixth metallization layer and electrically connecting the conductive lines 222C to the RF chips 208.

Please be noted that the RF chips 208 may be corresponding but not aligned with the respective antenna patches 206 due to the presence of the signal channel 212. The RF chips 208 are illustrated in FIG. 2B to be aligned with the antenna patches 206 just for illustrative purposes, and are not meant to dictate the necessary alignment between the antenna patch 206 and the respective RF chip 208.

In some embodiments, the conductive lines 222A, 222B, 222C and 210 and the conductive vias 224A and 224B are formed of conductive materials, such as copper, tungsten, aluminum, titanium, tantalum, alloys thereof, or the like. The conductive lines 222A, 222B, 222C and the conductive vias 224A and 224B are further electrically insulated by an insulating material 226A, 226B or 226C, such as a polymer-based material, e.g., polyimide or epoxy resin.

Figure 2C:
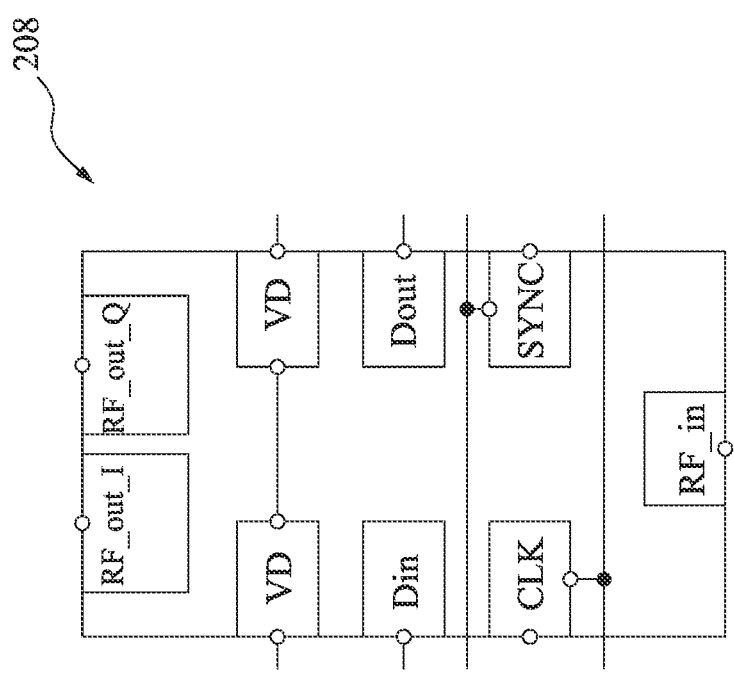
FIG. 2C is a schematic top view of a radio-frequency (RF) chip in the transmitter or receiver shown in FIG. 2A, in accordance with some embodiments.

FIG. 2C is a schematic top view of the RF chip 208 in the antenna device 200A of the transmitter 200 or receiver 200 shown in FIG. 2A, in accordance with some embodiments. In embodiments where a transmitter 200 is concerned, each RF chip 208 includes input ports for receiving an RF input signal RF_in, a supply voltage VD, calibration data Din, a data clock signal CLK and a synchronization clock signal SYNC. In some embodiments, each RF chip 208 includes output ports for outputting the calibration data Dout and two components of the RF output signal RF_out, i.e., an in-phase RF signal RF_out_I and a quadrature RF signal RF_out_Q.

In some embodiments, the RF output signal RF_out is formed of the in-phase component RF_out_I and the quadrature component RF_out_Q corresponding to the horizontal (H)-polarization and vertical (V)-polarization components, respectively of the RF output signal RF_out. The separate signal components RF_out_I and RF_out_Q represent the in-phase component RF_out_I and the quadrature component RF_out_Q, and they will be tuned in quadrature with each other after phase calibration and before being combined together for transmission. The arrangement of separating the quadrature components of the RF output signal RF_out may aid in calibration of components the RF signal RF_in independently.

In embodiments where a receiver 200 is concerned, each RF chip 208 includes input ports for receiving the two components of the RF signals RF_out_I and RF_out_Q, the supply voltage VD, the calibration data Din, the data clock signal CLK and the synchronization clock signal SYNC. In some embodiments, each RF chip 208 includes output ports for outputting the calibration data Dout and an RF signal RF_in. The calibration data Din, the data clock signal CLK and the synchronization clock signal SYNC are collectively referred to herein as the control signals.

In some embodiments, the abovementioned control signals Din, CLK and SYNC are generated by a controller of the transmitter or receiver 200. The calibration data Din may include amplitude calibration data or phase calibration data, or both. In some embodiments, the calibration data Din are used to independently calibrate the amplitudes or phases of the RF output signals RF_out_I and RF_out_Q in a transmitter 200 according to the calibration data Din before they are coupled together and transmitted. At this stage, the RF output signals RF_out_I and RF_out_Q are in phase with each other before they are phase-calibrated and output from the chip 208. In some embodiments, the calibration data Din are used to independently calibrate the amplitudes or phases of the input RF_signals RF_out_I and RF_out_Q in a receiver 200 after the RF signals RF_out_I and RF_out_Q are received from the antenna patch 206 and before they are combined in the RF chip 208. After amplitude and phase calibration, the input RF signals RF_out_I and RF_out_Q will be made in phase with each other before they are combined and transmitted.

In some embodiments, the data clock signal CLK is used to provide a generic clock for the registers in the components of the RF chip 208. The frequency of the data clock signal CLK may represent the working frequency of the digital data processing in the RF chip 208. In some embodiments, the synchronization clock signal SYNC may be used to provide a clock to synchronize the operation of the RF chips 208 and/or used to provide a clock for some of the registers in different stages to output the calibration data at the same clock time. The synchronization clock signal SYNC may represent the update rate of the calibration data. In some embodiments, since the control signals include a digital form, they are also referred to as digital control signals.

Figure 3:
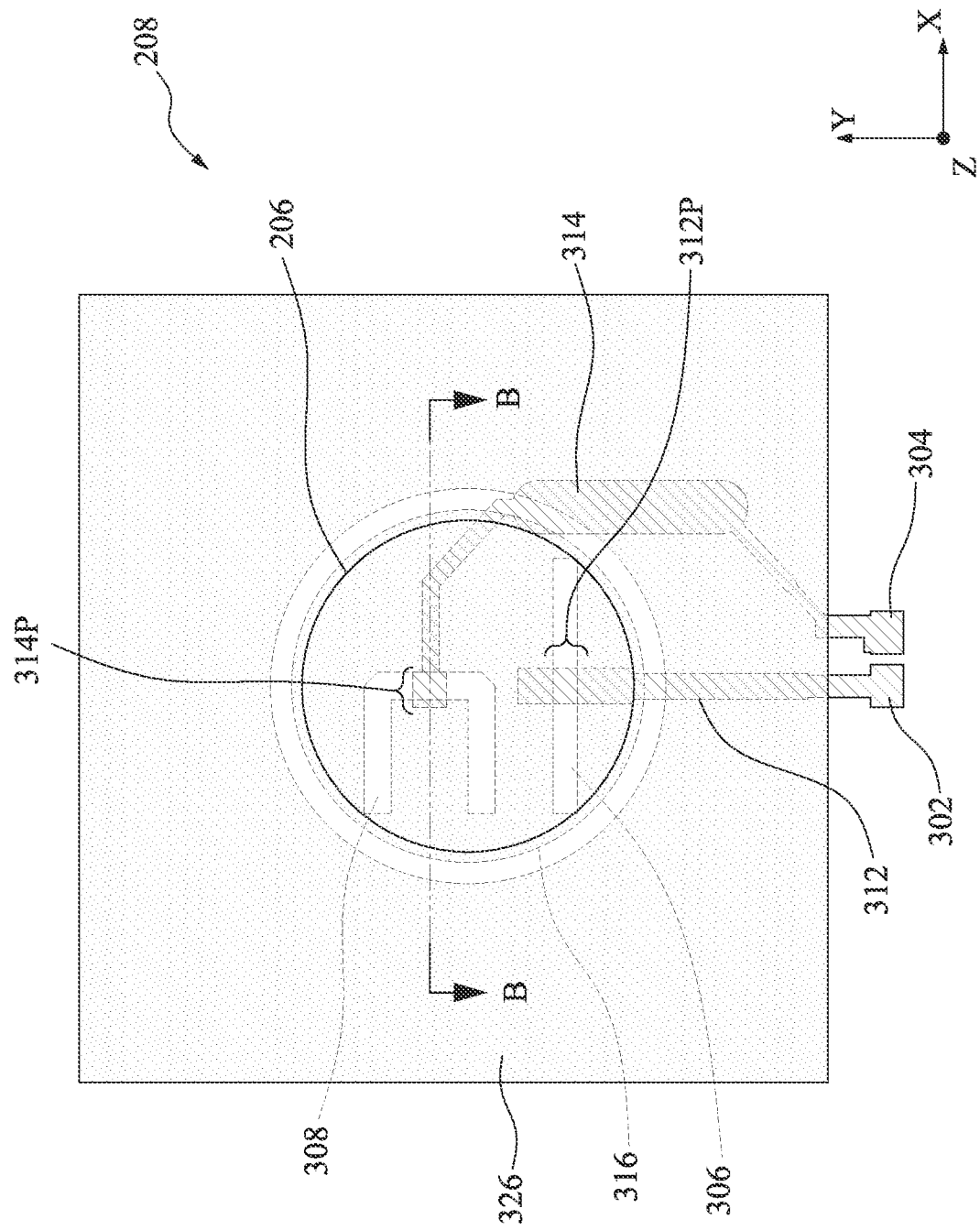
FIG. 3 is a schematic plan view of an antenna device of the transmitter or receiver shown in FIG. 2A, in accordance with some embodiments.

FIG. 3 is a schematic plan view of an example antenna device 200A of the antenna array in the transmitter or receiver 200 shown in FIG. 2A, in accordance with some embodiments. The cross-sectional view of FIG. 2B is taken also from the sectional line BB of FIG. 3. In some embodiments, the antenna device 200A includes signal ports 302 and 304, in which the signal ports 302 and 304 are configured as output signal ports in a transmitter 200 to transmit the RF signal RF_in from an RF signal source, through the RF chip 208, to the antenna device 200A. Alternatively, the signal ports 302 and 304 are configured as input ports in a receiver 200 to receive the RF signal RF_in form the antenna patch 206 to a signal reception module (not separately shown) through the RF chip 208. In some embodiments, referring to FIGS. 2B and 3, the signal ports 302 and 304 are formed in the second metallization layer of the interconnect structure 204 below the first metallization layer and electrically connected to the input/output ports of the RF signals RF_out_I and RF_out_Q of the corresponding RF chip 208, as shown in FIG. 2C.

In some embodiments, the antenna device 200A further includes a first feed line 312 and a second feed line 314 adjacent to the first feed line 312. In some embodiments, the values of the lengths, widths, the orientations, and the shape of first feed line 312 and the second feed line 314 may be designed or adjusted for matching impedance of the transmission lines during the designing or manufacturing stage. In some embodiments, the first feed line 312 or the second feed line 314 is design to have an input impedance of about 50 ohms to match the output impedance of the signal ports 302, 304.

In some embodiments, the first feed line 312 and the second feed line 314 have different lengths to provide different phases at coupling nodes 312P and 314P of the first feed line 312 and the second feed line 314, respectively (see FIG. 2B for reference to the coupling node 314P). In some embodiments, the second feed line 314 is longer than the first feed line 312, and the length difference is designed such that the phase difference between the coupling nodes 312P and 314P is substantially 90 degrees. In other words, the first feed line 312 and the second feed line 314 are configured to provide a same RF signal RF_in with the same initial phases at the signal ports 302 and 304 in an ideal situation. The power of the RF signal RF_in is split into two halves for the RF output signal RF_out_I and RF_out_Q. After propagation along the first feed line 312 and the second feed line 314, the length difference between the first feed line 312 and the second feed line 314 causes the RF output signal RF_out_I and RF_out_Q in quadrature to each other at the coupling node 312P and 314P, respectively, or equivalently, being in a phase difference of substantially 90 degrees. In some embodiments, phase calibration are performed on the RF output signal RF_out_I and RF_out_Q after they are split and before they are fed in to the first feed line 312 and the second feed line 314, respectively, if a phase error has been identified. The phase calibration is performed to compensate for the phase error between the actual phase difference between the RF output signal RF_out_I and RF_out_Q at the coupling node 312P and 314P and the ideal phase difference, i.e., 90 degrees. In some embodiments, the phase error may occur due to process variations or impedance mismatching in manufacturing the first feed line 312 and the second feed line 314, leading to undesired phase error between the first feed line 312 and the second feed line 314.

In some embodiments, the antenna device 200A further includes a first slit 306 and a second slit 308 formed in the first metallization layer of the interconnect structure 204. In some embodiments, the first slit 306 and the second slit 308 are formed on the lower surface of the substrate 202 and arranged between the substrate 202 and the first feed line 312 and the second feed line 314, respectively (see FIG. 2B for reference to the second slit 308). The first slit 306 and the second slit 308 may be separate from each other to aid in signal separation and isolation. In some embodiments, the antenna device 200A also includes a local ground plate 316 defining and laterally surrounding the first slit 306 and the second slit 308. The local ground plate 316 may include a portion separating the first slit 306 from the second slit 308. In some embodiments, the local ground plate 316 is in a circular shape or an elliptical shape. In some embodiments, the local ground plate 316 has a truncated sector on its circumference to compensate for the non-ideal field profile resulting from the non-ideal amplitudes or phases of the RF output signals RF_out_I and RF_out_Q, even after amplitude and phase calibration.

In some embodiments, each of the first feed line 312 and the second feed line 314 has first end (around the RF chip 208) connected to the signal port 302 and 304, respectively, and a second end (around the coupling nodes 312P and 314P) overlapping the first slit 306 and the second slit 308, respectively. In some embodiments, as shown in FIG. 3, the second end includes a protrusion crossing the first slit 306 or the second slit 308 for meeting the impedance matching requirements.

The in-phase RF signal RF_out_I and the quadrature RF signal RF_out_Q are coupled to the antenna patch 206, combined and radiated outwardly through the antenna patch 206. The combined RF signal RF_out from the in-phase RF signal RF_out_I and the quadrature RF signal RF_out_Q results in a circularly polarized RF signal RF_out. In some embodiments, the combined RF signal RF_out is a right-hand circularly polarized RF signal or a left-hand circularly polarized RF signal dependent upon the order of phases of the in-phase RF signal RF_out_I with respect to the quadrature RF signal RF_out_Q. In some embodiments, since the ideal circular polarization of the RF signal output RF_out is determined by the equal amplitudes and the accurate phase difference of 90 degrees between the in-phase RF signal RF_out_I and the quadrature RF signal RF_out_Q, the effectiveness of the calibration data Din plays an important role. In some embodiments, the in-phase RF signal RF_out_I and the quadrature RF signal RF_out_Q are split before they are transmitted to the antenna patch 206 and subjected to the amplitude calibration and phase calibration independently. Alternatively, in some embodiments, the in-phase RF signal RF_out_I and the quadrature RF signal RF_out_Q are received from the antenna patch 206 and subjected to the amplitude calibration and phase calibration independently in the RF chip 208 before they are combined and transmitted out of the RF chip 208. Therefore, the calibration task can be achieved easily without complicated calibration circuitry.

In some embodiments, the local ground plate 316, the first slit 306 and the second slit 308 are formed on the first metallization layer of the interconnect structure 204 by patterning the conductive layer of the first metallization layer, wherein the first slit 306 and the second slit 308 are formed by further patterning the local ground plate 316. The first slit 306 and the second slit 308 at least partially overlap the coupling nodes 312P and 314P, respectively, for maximizing signal radiation from the first slit 306 and the second slit 308. In some embodiments, the coupling node 312P or 314P extends beyond the first slit 306 or the second slit 308 and forms a protrusion of the first feed line 312 or the second feed line 314 to seek better impedance matching.

As discussed previously, the substrate 202 can be made as transparent or non-transparent according to selection of the material of the substrate 202. In the depicted embodiments, the substrate 202 is formed of transparent materials, such as glass, fused silica, silicon oxide, quartz or the like. Therefore, first slit 306, the second slit 308 and the portions of the substrate 202 aligned with the first slit 306 and second slit 308 form a first signal channel and a second signal channel, respectively, as exemplified by the signal channel 212 shown in FIG. 2B. The first signal channel and the second signal channel are arranged substantially within the coverage of the antenna patch 206 of the antenna device 200A and configured to electrically or electromagnetically couple the RF signals RF_out_I and RF_out_Q between the antenna patch 206 and feed lines 312 and 314 through the respective first slit 306 and second slit 308, and the first and second signal channels.

In some embodiments, the antenna device 200A also includes a general ground plate 326 arranged in the first metallization layer. The general ground plate 326 may be separated from the local ground plate 316 by an annular opening. In some embodiments, the local ground plate 316 and the general ground plate 326 are grounded to a common ground terminal (not separately shown) of the antenna device 200A or the transmitter or receiver 200. In some embodiments, the general ground plate 326 is used to separate the respective antenna device 200A from adjacent antenna devices 200A. The general ground plate 326 may include a rectangular or square circumference. In some other embodiments, the general ground plate 326 is in other shapes for compensating for the electric fields generated by the antenna patch 206. In some embodiments, the general ground plate 326 has four sides, and each side of the general ground plate 326 is substantially parallel to one side of the antenna array, e.g., along the X-axis or Y-axis, as shown in FIGS. 2A and 3. In some embodiments, each side of the general ground plate 326 is substantially parallel or perpendicular to the direction of at least one section of the first slit 306 or the second slit 308, e.g., along the X-axis or Y-axis. In some embodiments, the four sides of the general ground plates 326 have an included angle, e.g., 45 degrees, with the first slit 306 or the second slit 308. The four sides of the general ground plates still keep a rectangular shape. In some embodiments, the adjacent general ground plates 326 are connected to each other to form a common ground, e.g., through a bridging portion between the adjacent general ground plates 326.

Figure 4:
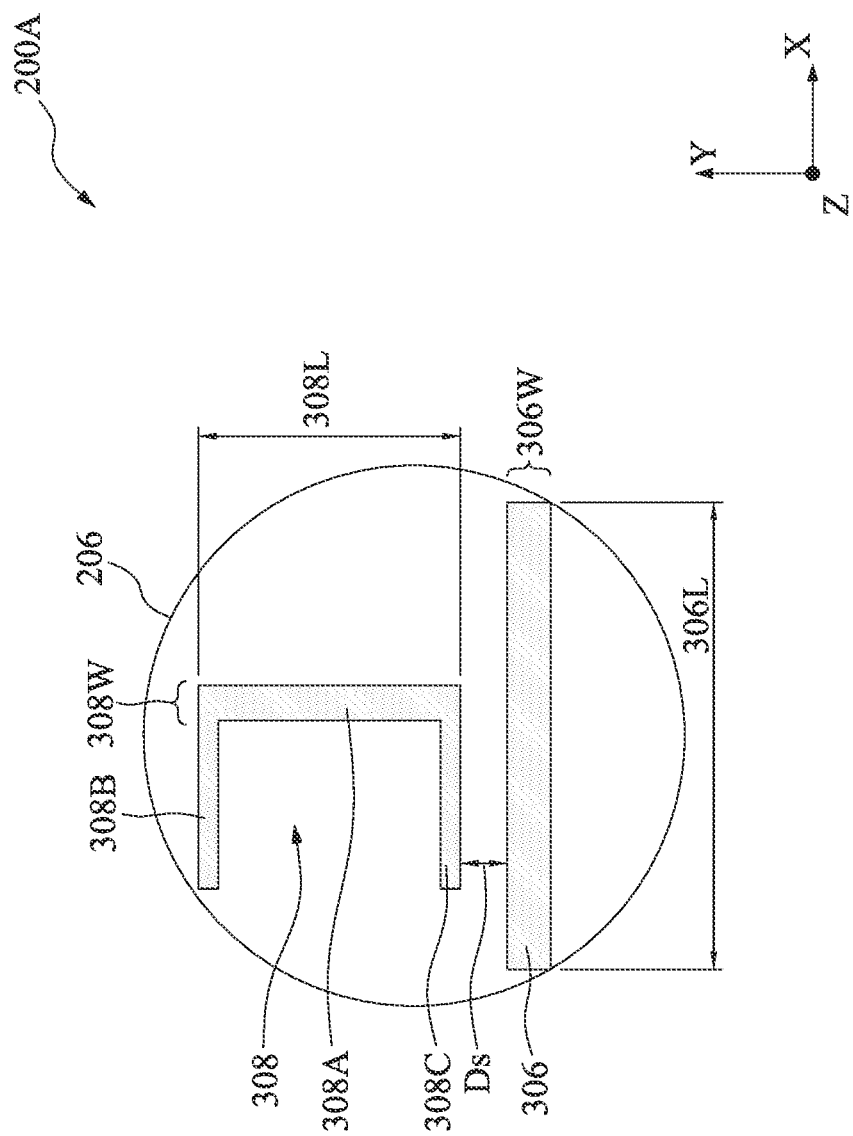
FIG. 4 is an enlarged view of slits of the antenna device shown in FIG. 3, in accordance with some embodiments.

FIG. 4 is an enlarged view of first slit 306 and the second slit 308 of the antenna device 200A shown in FIG. 3, in accordance with some embodiments. In some embodiments, the first slit 306 and the second slit 308 are substantially fully covered by or at least partially overlapped with the antenna patch 206 to maximize the coupling efficiency of the RF signals RF_out_I and RF_out_Q. In some embodiments, the first slit 306 has a primary section 306 extending in the X-axis, while the second slit 308 has a primary section 308A extending in the Y-axis (see FIG. 2B for reference to the primary section 308A). The primary sections 306 and 308A of the respective first slit 306 and second slit 308 are substantially perpendicular to each other, whereby the RF quadrature signals RF_out_I and RF_out_Q can be transmitted separately through the primary sections 306 and 308A, respectively, or vice versa. In some embodiments, the in-phase RF signal RF_out_I and the quadrature RF signal RF_out_Q represent the RF signals in the horizontal polarization and the vertical polarization, respectively, or alternatively, in the vertical polarization and the horizontal polarization, respectively.

In some embodiments, the first slit 306 is in a bar shape, a strip shape, a line shape or an "I" shape. In some embodiments, either the first slit 306 or the second slit 308, or both, includes one or more secondary sections extending from the respective primary sections. The secondary sections may not aid in improving the transmission or reception power, but may be helpful in achieving impedance matching. As shown in FIG. 4, the second slit 308 includes a first secondary section 308B and a second secondary section 308C, wherein the secondary sections 308B and 308C are connected to the two ends of the primary section 308A to form a U-shaped slit. In some embodiments, the secondary sections 308B and 308C are perpendicular to the primary section 308A and parallel to the primary section 306.

In some embodiments, the first slit 306 has a length 306L measured along the X-axis. In some embodiments, he primary section 308A the second slit 308 has a length 308L measured along the Y-axis. The length 306L or 308L is determined based on design requirements. In some embodiments, the greater the length 306L or 308L is made, the more power of the RF signal is passed through the first slit 306 or the second slit 308. However, when the first slit 306 or the second slit 308 extends beyond the projected area of the antenna patch 206, the coupling efficiency of the RF signals will be decreased.

In some embodiments, the first slit 306 has a width 306W measured along the Y-axis. In some embodiments, the primary section 308A of the second slit 308 has a width 308W measured along the X-axis. The width 306W or the width 308W is determined based on the range of the operation frequency for the antenna device 200A. On the one hand, if the width 306W or 308W is smaller than the minimal width limit, e.g., smaller than the wavelength of the in-phase RF signal RF_out_I or quadrature RF signal RF_out_Q, the RF signals may refract into the first slit 306 or the second slit 308, and undesired destructive interference may occur. On the other hand, if the width 306W or 308W is greater than the maximal width limit, wideband signals of undesired frequencies apart from the operation frequency of the antenna device 200A may be introduced into the RF signals. Therefore, the width 306W or 308W should be determined within a suitable range and adapted to the operating frequency of the antenna device 200A.

In some embodiments, the primary section 306 and the primary section 308A is separated by a distance Ds or spacing. In some embodiments, the greater the distance Ds, the better quadrature signal isolation it will achieve. When the signal coupling between the in-phase RF signal RF_out_I and the quadrature RF signal RF_out_Q is made low (i.e., in a status of high signal isolation), the performance of independent amplitude or phase calibration for the in-phase RF signal RF_out_I and the quadrature RF signal RF_out_Q will be made better. However, the increase of the distance Ds is attained at the price of the antenna footprint. Therefore, a trade-off should be made between the signal isolation and antenna size.

Figure 5:
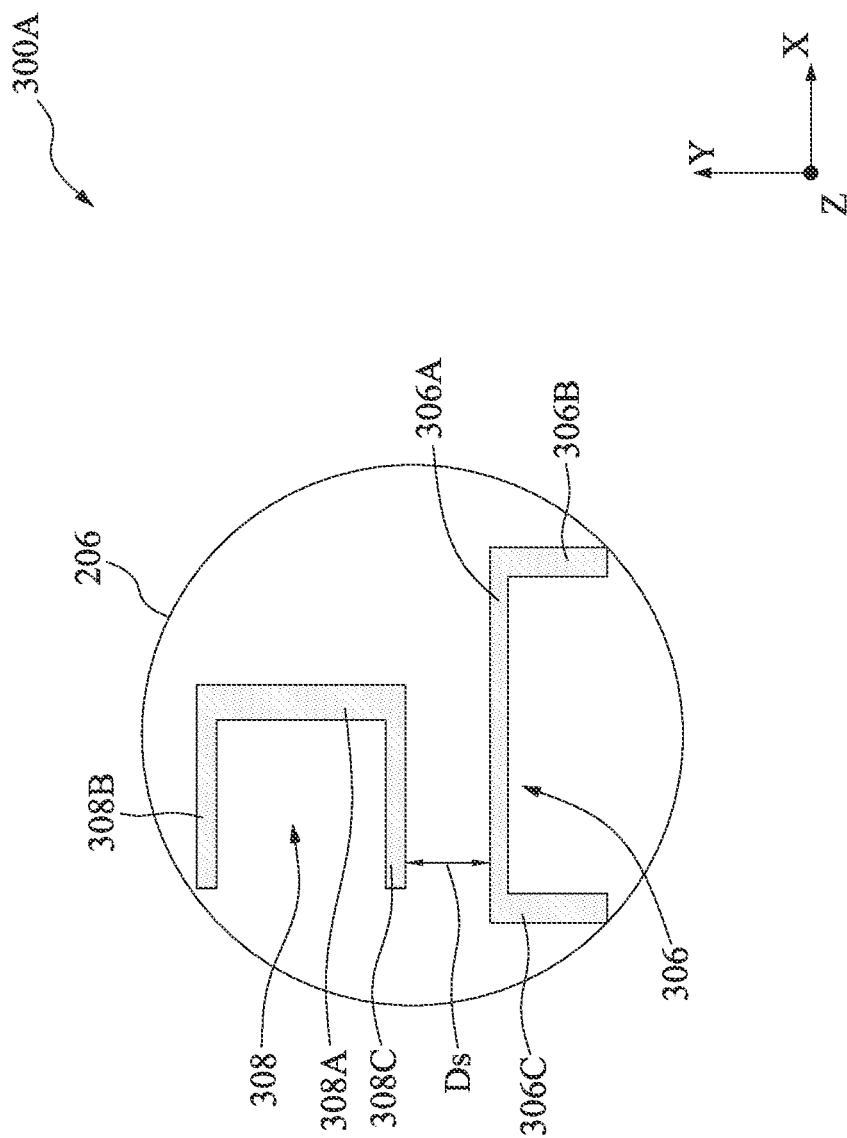
FIG. 5 is a schematic top view of slits of the antenna device shown in FIG. 3, in accordance with some other embodiments.

FIG. 5 is a schematic top view of slits of an antenna devices 300A shown in FIG. 3, in accordance with some other embodiments. The antenna devices 300A is similar to the antenna device 200A, and thus the similar features would not be repeated for brevity. The antenna device 300A is different from the antenna devices 200A mainly in that the first slit 306 further includes a first secondary section 306B and a second secondary section 306C extending in the Y-axis. In some embodiments, the first secondary section 306B and the second secondary section 306C are connected to the respective two ends of the primary section 306A to thereby form a U-shaped slit. In some embodiments, the secondary section 306B or 306C is perpendicular to the primary section 306A and the secondary sections 308B, 308C, or is parallel to the primary section 308A. In some embodiments, one or both of the first slit 306 and the second slit 308 has only one secondary section, and thus the first slit 306 or the second slit 308, or both includes an L shape.

Figure 6:
FIG. 6 is a schematic block diagram of a phase calibration table, in accordance with some embodiments.

FIG. 6 is a schematic block diagram of a phase calibration table 600, in accordance with some embodiments. The phase calibration table 600 represents a phase compensation value for each of the antenna devices in an example 12×12 antenna array. The numbers of the phase compensation values are shown in the unit of degrees and represent the phase compensation value for the quadrature RF signal RF_out_Q with respect to the in-phase RF signal RF_out_I serving as the calibration reference.

From the phase calibration table 600, it can be seen that the phase compensation values are substantially zeros in the neighborhood of the central region of the 12×12 antenna array. This may be due to the fact that the antenna devices arranged around the central region experience a more uniform or symmetrical ground provided by the general ground plates 326 (see FIG. 3) in the neighborhood. As far as the antenna device closer to the peripheral region of the antenna array is concerned, the symmetry condition of the grounding provided by the general ground plates 326 continues to decrease until the antenna devices 200A arranged on the edges of the antenna array. As a result, the antenna devices arranged on the edges of the antenna array experience worst symmetry of the electric field, and thus the worst phase distortion thereof results. However, it can be shown in FIG. 6 that even in a large-scale 12×12 antenna array, the worst phase error is within about 16 degrees, which error can be calibrated easily with the proposed simple digital phase calibration procedure. Accordingly, the phase distortion in the phased antenna array can be calibrated with low cost.

Figure 7A:
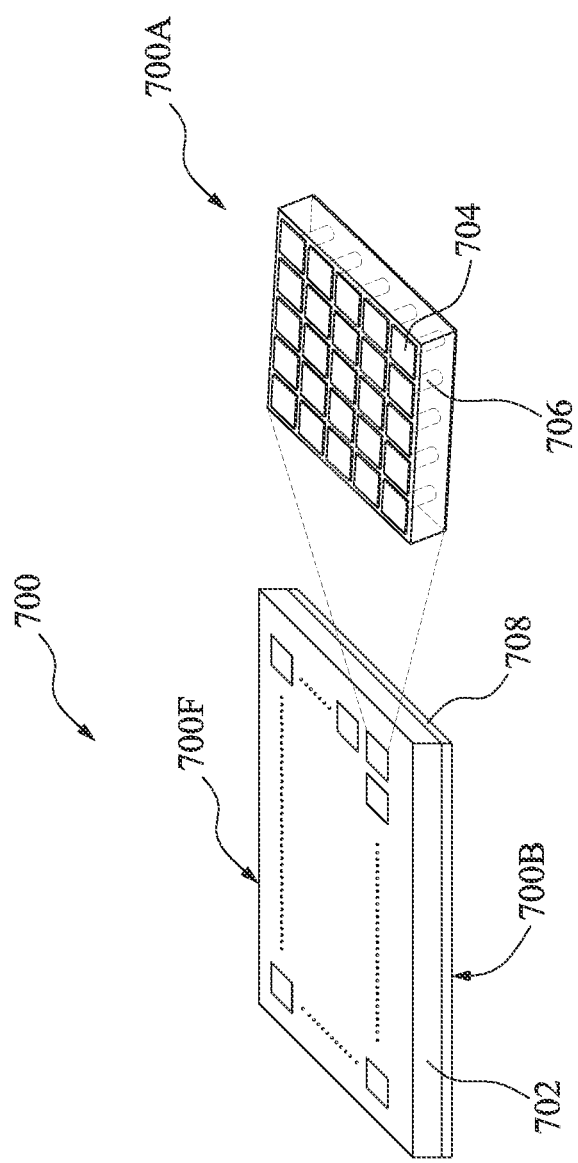
FIG. 7A is a schematic perspective view of an electromagnetic shielding structure, in accordance with some embodiments.

FIG. 7A is a schematic perspective view of an electromagnetic shielding array 700, in accordance with some embodiments. In some embodiments, the electromagnetic shielding array 700 is used in an antenna testing method, in which the radiation element of an antenna, e.g., the antenna patch 206 of the antenna device 200A, is blocked from radiating RF signals. In some embodiments, the electromagnetic shielding array 700 includes an array of electromagnetic shielding structures 700A arranged in rows and columns. In some embodiments, the shape of the electromagnetic shielding array 700 follows the shape of the antenna array 200 as shown in FIG. 2A. In some embodiments, the electromagnetic shielding array 700 includes a substrate 702. The substrate 702 may be formed of a semiconductor material, e.g., silicon, a dielectric material, such as silicon oxide, silicon nitride, or a polymer material, such as epoxy resin, polyimide, or other suitable materials. The electromagnetic shielding array 700 or the substrate 702 may include a front surface 700F and a back surface 700B opposite to the front surface 700F.

Each of the electromagnetic shielding structures 700A is formed of an array of conductive pads 704 formed on the front surface 700F of the substrate 702. In some embodiments, the conductive pads 704 are in a rectangular shape. The conductive pads 704 are separated from each other by a predetermined distance Dx. A common conductive layer 708 is formed on the back surface 700B of the substrate 702. A plurality of conductive vias 706 are formed through the substrate 702 and electrically connecting the common conductive layer 708 to the corresponding conductive pads 704. In some embodiments, the common conductive layer 708 has an area greater than each of the conductive pads 704. In the depicted embodiment, each electromagnetic shielding structure 700A includes a 5×5 array of the conductive pads 704, but the present disclosure is not limited thereto. Other numbers of the array size of the electromagnetic shielding structure 700A are also within the contemplated scope of the present disclosure.

Figure 7B:
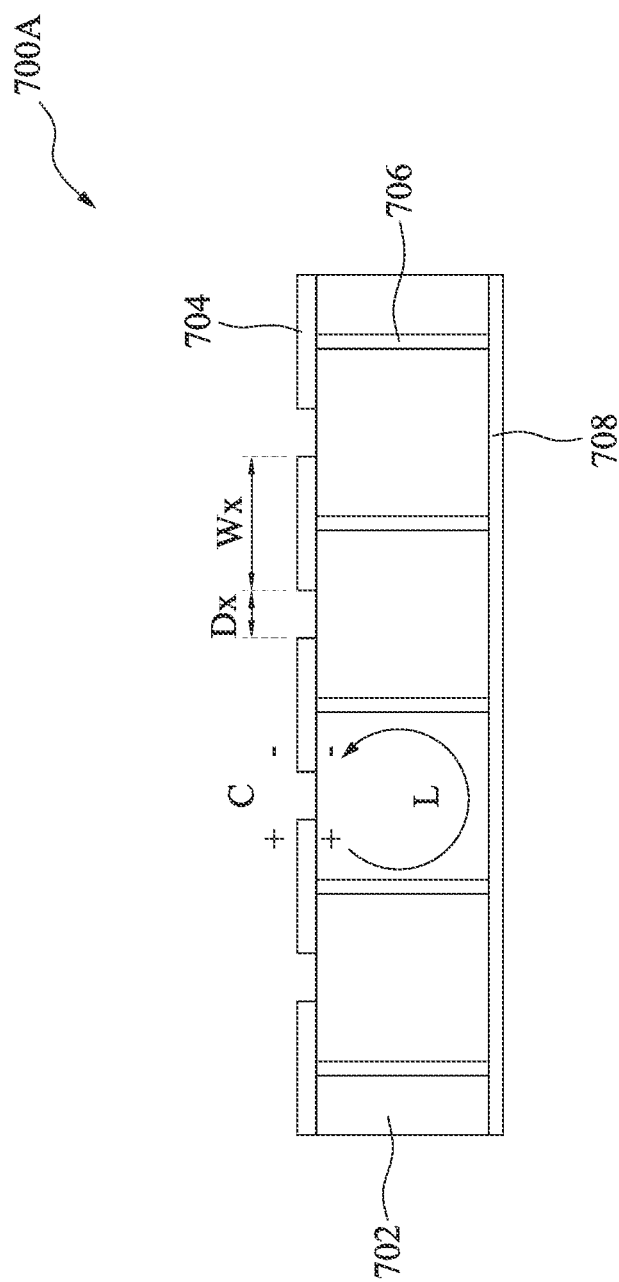
FIG. 7B is a schematic cross-sectional view of the electromagnetic shielding structure shown in FIG. 7A, in accordance with some embodiments.

FIG. 7B is a schematic cross-sectional view of the electromagnetic shielding structure 700A shown in FIG. 7A, in accordance with some embodiments. The common conductive layer 708 serves as the common ground of the electromagnetic shielding structure 700A. In some embodiments, the electromagnetic shielding structure 700A can be seen as a cascade of several equivalent inductor-capacitor (LC) circuits, in which the inductor L is connected to the capacitor C in parallel. The LC circuit would lead to the effect of a band-pass filter for passing a portion of the frequencies, while blocking another portion of the frequencies. In some embodiments, the frequency response or stopband range of the electromagnetic shielding structure 700A would be determined by the dimensions or widths Lx of the conductive pads 704 and the distance Wx or spacing between the conductive pads 704. Through suitable determination of the conductive pads 704 and the distance Dx, a band-pass filter for the RF signal RF_out can be realized by the electromagnetic shielding structure 700A.

Figure 8:
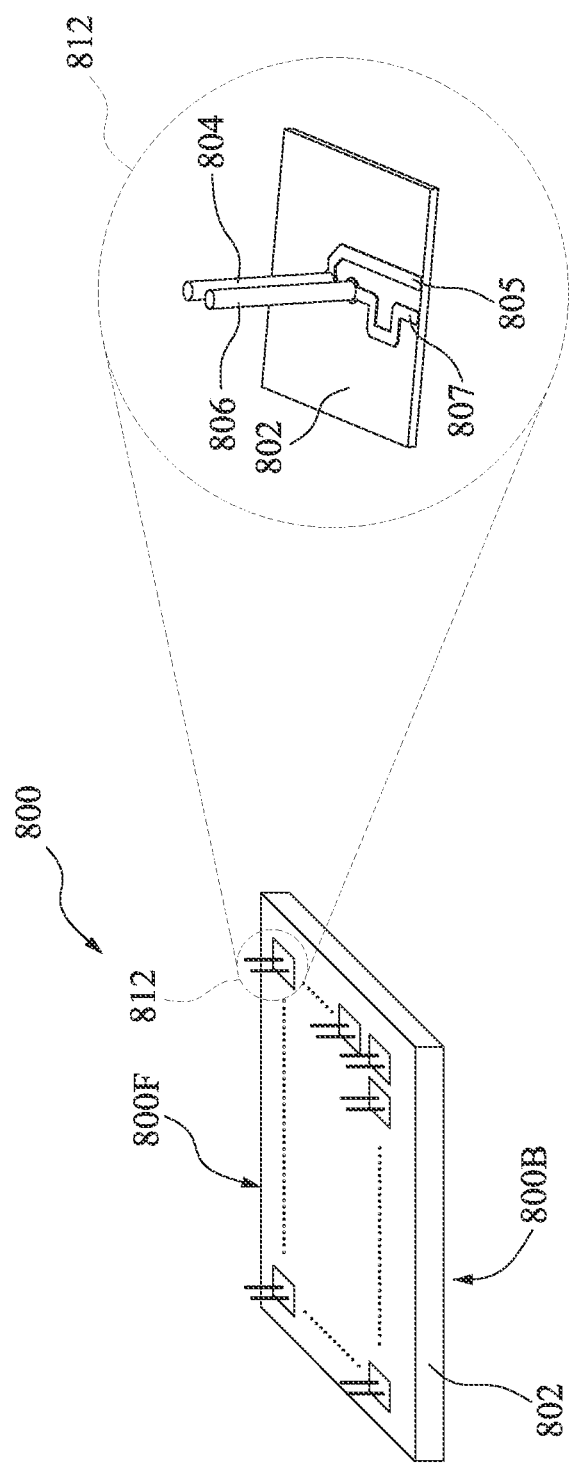
FIG. 8 is a schematic cross-sectional view of a testing probe device, in accordance with some embodiments.

FIG. 8 is a schematic cross-sectional view of a testing probe array 800, in accordance with some embodiments. In some embodiments, the testing probe array 800 is used in an antenna testing method with the electromagnetic shielding array 700, in which when the RF signals RF_out, including the in-phase RF signal RF_out_I and the quadrature RF signal RF_out_Q, that would otherwise be radiated from the antenna patch 206 of the antenna device 200A, are blocked by the electromagnetic shielding array 700, the RF signals RF_out_I and RF_out_Q can be acquired through the feed lines 312 or 314 and examined.

In some embodiments, the testing probe array 800 includes an array of testing probe devices 800A arranged in rows and columns. In some embodiments, the shape of the testing probe array 800 follows the shape of the antenna array 200 as shown in FIG. 2A. In some embodiments, the testing probe array 800 includes a substrate 802. The substrate 802 may be formed of a semiconductor material, e.g., silicon, or a dielectric material, such as silicon oxide, silicon nitride, or a polymer material, such as epoxy resin, polyimide, or other suitable materials. The testing probe array 800 or the substrate 802 may include a front surface 800F and a back surface 800B opposite to the front surface 800F. A plurality of probe needle set 812 are formed on the front surface 800F. The probe needle set 812 may include a pair of probe needles 804, 806 configured to probe the first feed line 312 and the second feed line 314, respectively, and examine whether the RF signals RF_out_I and RF_out_Q have substantially equal amplitude and a predetermined phase difference of substantially 90 degrees. In some embodiments, the probe needles 804, 806 include spring needles or other suitable testing probes.

In some embodiments, the substrate 802 includes a patterned transmission lines 805, 807 formed on the front surface 800F or an encapsulated surface of the substrate 802. The transmission lines 805, 807 may be electrically connected to a testing tool, e.g., an oscilloscope, a signal analyzer or a network analyzer. In some embodiments, the probe needles 804, 806 are electrically connected to the testing tool through the transmission lines 805 and 807, respectively. In some embodiments, the first feed line 312 and the second feed line 314 include respective probing regions, and the locations of the probe needles 804 and 806 and the spacing between the probe needles 804 and 806 are determined to be aligned with the probing regions of the first feed line 312 and the second feed line 314, respectively.

Figure 9:
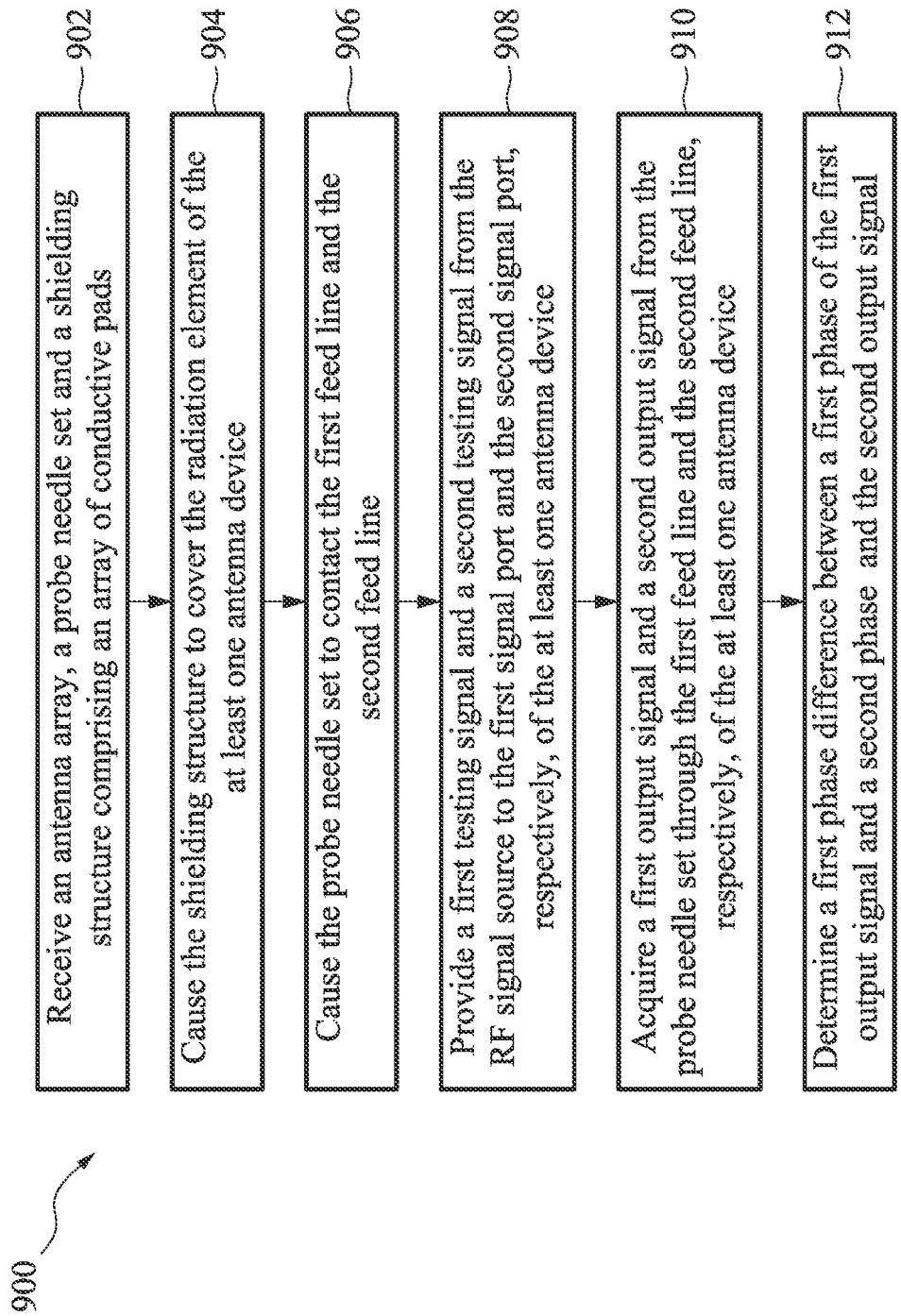
FIG. 9 is a schematic flowchart of a method of testing a phased antenna array, in accordance with some embodiments.
Figure 10A:
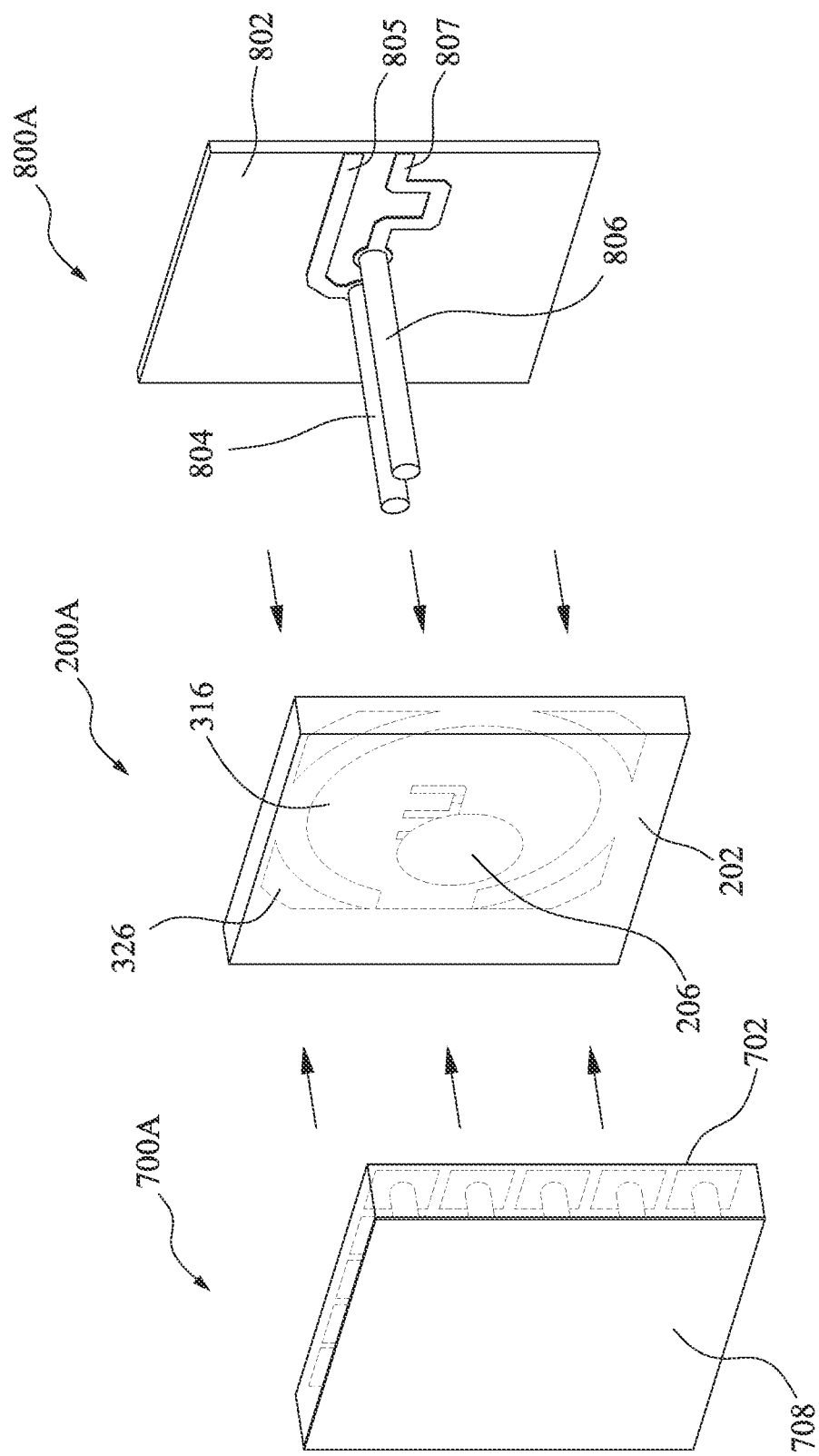
FIGS. 10A and 10B shows schematic block diagrams of a testing operation shown in FIG. 9, in accordance with some embodiments.
Figure 10B:
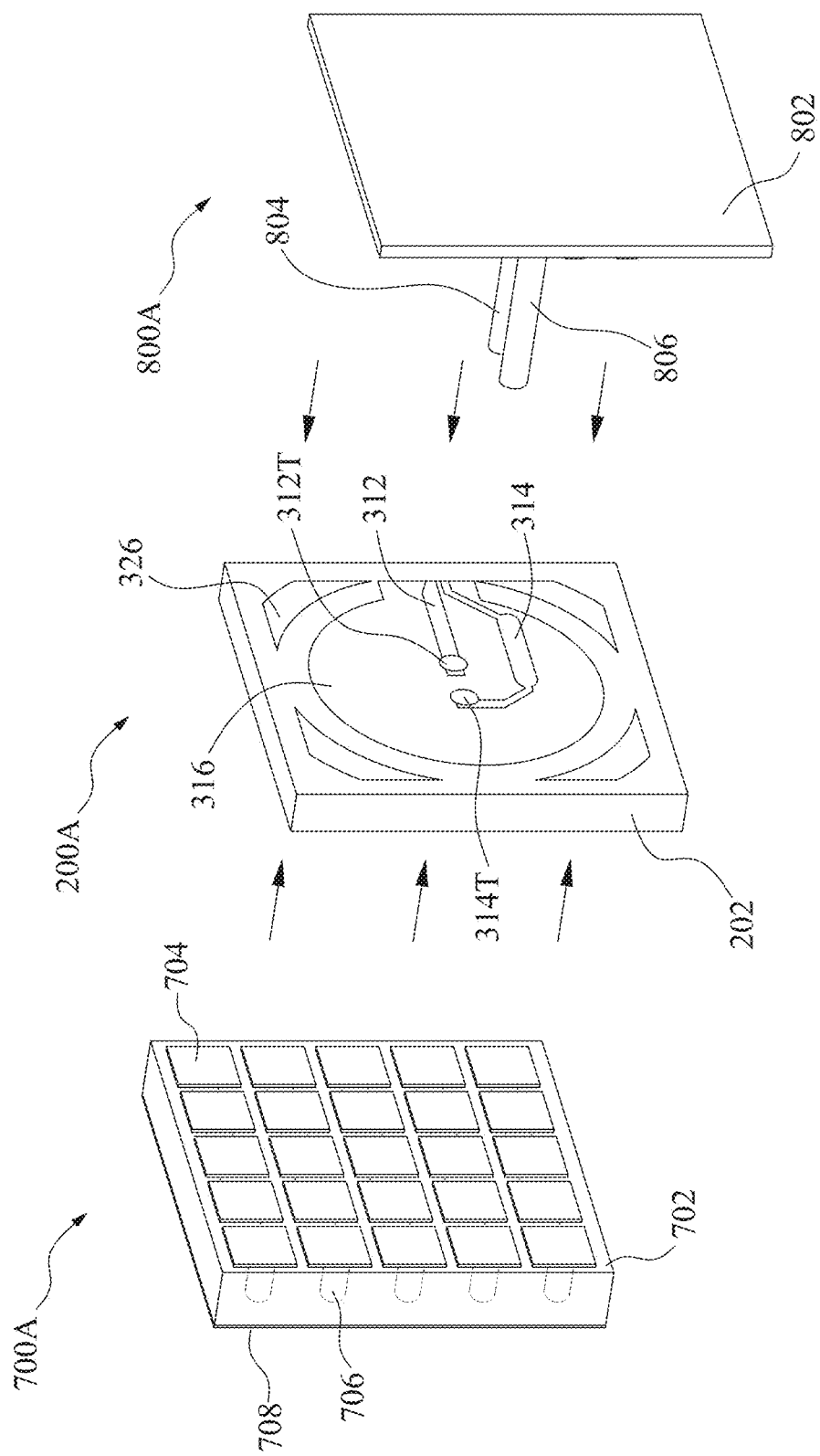

FIG. 9 is a schematic flowchart of a method 900 of testing an antenna array, e.g., the antenna array 200, in accordance with some embodiments. FIGS. 10A and 10B show schematic block diagrams of a testing operation, in accordance with some embodiments. It shall be understood that additional steps can be provided before, during, and after the steps in method 900, and some of the steps described below can be replaced with other embodiments or eliminated. The order of the steps shown in FIG. 9 may be interchangeable. Some of the steps may be performed concurrently or independently.

At step 902, an antenna array, a probe needle set and a shielding structure including an array of conductive pads are received or provided. In some embodiments, the antenna array is similar to the antenna array 200. The probe needle set may be similar to the probe needle set 812. The shielding structure may be similar to the electromagnetic shielding structure 700A.

At step 904, the shielding structure is caused to cover the radiation element or antenna patch 206 of the at least one antenna device 200A, as shown in FIGS. 10A and 10B. In some embodiments, the electromagnetic shielding structure 700A is aligned with the antenna device 200A or the antenna patch 206 of the antenna device 200A. In some embodiments, the conductive pads 704 of the electromagnetic shielding structure 700A are in physical contact with the antenna patch 206.

At step 906, the probe needle set is caused to contact the first feed line and the second feed line. In some embodiments, the two probe needles 804, 806 are adapted to contact the first feed line 312 and the second feed line 314 for receiving the in-phase RF signal RF_out_I and the quadrature RF signal RF_out_Q. In some embodiments, referring to FIGS. 2B, 3 and 10A, the first feed line 312 and the second feed line 314 each include a probing region 312T and 314T exposed from the insulating material 226C. In some embodiments, the conductive lines 222A, 222B or 222C are formed of conductive materials, such as copper or other suitable materials. In some embodiments, as shown in FIG. 10B, the first feed line 312 and the second feed line 314 include the respective probing regions 312T and 314T adapted to receive or contact the probe needles 804 and 806. In some embodiments, the probing regions 312T and 314T is located at the coupling node 312P and 314P of the first feed line 312 and the second feed line 314, e.g., at a location overlapping the first slit 306 and the second slit 308, respectively, for reflecting the actual RF signal amplitudes and phases when they are coupled to or from the antenna patch 206.

In some embodiments, when the probing regions 312T and 314T are not protected by the insulating material 226C, the probing regions 312T and 314T may include an anti-erosion coating formed on the exposed surface of the probing regions 312T and 314T to prevent erosion of the underlying conductive material, e.g., copper. In some embodiments, the anti-erosion coating is a composite nickel-gold layer, or is referred to as an electro-less nickel immersion gold (ENIG) layer. Through the treatment on the probing regions 312T and 314T with the ENIG layer, the testing can be performed more reliably without adverse impact of the conductivity loss due to erosion at the probing regions 312T and 314T.

At step 908, a first testing signal and a second testing signal are provided from the RF signal source, e.g., an RF signal generator of a testing tool, to the first signal port (e.g., signal port 302) and the second signal port (e.g., signal port 304), respectively, of the at least one antenna device. For example, the first signal port 302 and the second signal port 304 are configured to receive the first testing signal and the second testing signal, respectively, from the RF chip 208. In some embodiments, in the absence of any amplitude calibration or phase calibration information on the antenna devices, the first testing signal and the second testing signal are provided with substantially equal amplitudes and the same phases, say zero degrees.

At step 910, a first output signal and a second output signal are acquired by the signal analyzer from the probe needle set 812 through the first feed line (e.g., the first feed line 312) and the second feed line (e.g., the second feed line 314), respectively, of the at least one antenna device. With help of the electromagnetic shielding array 700 or one or more of the electromagnetic shielding structures 700A, the RF signals RF_out_I and RF_out_Q would not be radiated outwardly by the antenna patch 206. Rather, the antenna patch 206 is seen as an open circuit, and therefore RF signals RF_out_I and RF_out_Q can be received as the first output signal and the second output signal, respectively, through the first feed line 312 and the second feed line 314 at the corresponding probing regions 312T and 314T.

At step 912, a first phase difference between a first phase of the first output signal and a second phase of the second output signal is determined, e.g., by the testing tool or the signal analyzer. In some embodiments, it is identified by the testing tool or the signal analyzer whether a phase error exists between the first output signal and the second output signal. In some embodiments, the phase error identification or determination proceeds simultaneously for all or a portion of the antenna devices 200A in the antenna array 200. In some embodiments, the phase error identification or determination proceeds with the antenna devices 200A one by one.

In some embodiments, the electromagnetic shielding array 700 (or one or more of the electromagnetic shielding structures 700A), the testing probe array 800 (or one or more of the testing probe devices 800A) and the testing tool (including the RF signal generator and the signal analyzer) are collectively referred to herein as a testing system for testing the array of the antenna devices 200A at the same time, or performing the testing on the antenna devices 200A one by one.

In some embodiments, a phase error Ph_e being identify as a first phase Ph_1 of the first output signal subtracted by a second phase Ph_2 of the second output signal, as expressed in the following formula:

$$Ph\_2-Ph\_1=90+Ph\_e,$$

In the above formula, the phase error Ph_e is a non-zero value. Subsequently, to compensate for the phase error, a second testing operation is performed, in which the first testing signal and a third testing signal are provided in a second testing operation from the RF signal source or the RF signal generator of the testing tool, wherein the first testing signal and the third testing signal are the same RF signal, and a second phase difference Ph_k being defined as the first phase Ph_1 of the first testing signal subtracting a third phase Ph_3 of the third testing signal at the initial phase, which is equal to the phase error, i.e., $$Ph\_k=Ph\_1-Ph\_3=Ph\_e.$$

That is because, in this way, the third testing signal after phase calibration is provided with an initial phase of −Ph_k, and thus the phase difference between the third output signal and the first output signal would be $$Ph\_3-Ph\_1=-Ph\_k+90+Ph\_e=90.$$

The resulting phase difference between the first feed line and the second feed line would be a perfect 90-degree difference after phase calibration. In some embodiments, the second testing operation is omitted, and the RF chip 208 directly set the output signals of the first signal port 302 and the second signal port 304 with initial phases of zeros and −Ph_k degrees, respectively. The resulting in-phase RF signal RF_out_I and quadrature RF signal RF_out_Q would be in quadrature with a phase difference of substantially 90 degrees.

Although the amplitude calibration procedure is not explained herein in detail, the same phase calibration procedure discussed above can also be applicable to the amplitude calibration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for testing an antenna array, comprising:
receiving a probe needle set and a shielding structure, wherein the shielding structure comprises an array of conductive pads, wherein the antenna array includes a substrate and an array of antenna devices, each of the antenna devices comprising:
a first slit and a second slit arranged in a first layer on a first surface of the substrate;
a first signal port and a second signal port arranged in a second layer adjacent to the first layer;
a first feed line and a second feed line arranged in the second layer and connected to the first signal port and the second signal port, respectively, wherein the first feed line and the second feed line have different line lengths; and
a radiation element disposed in a third layer on a second surface of the substrate opposite to the first surface;
causing the shielding structure to cover the radiation element of at least one antenna device; and
causing the probe needle set to contact the first feed line and the second feed line for testing the at least one antenna device.

2. The method of claim 1, wherein each of the antenna devices further comprises a first ground plate arranged in the first layer, wherein the first slit and the second slit are defined by the first ground plate.

3. The method of claim 1, wherein the array of conductive pads are arranged to physically contact the corresponding radiation element of the at least one antenna device.

4. The method of claim 1, wherein each of the first feed line and the second feed line comprises a probing region exposed from an insulating material, wherein the probe needle set comprises two probe needles configured contact the probing region of each of the first feed line and the second feed line, respectively.

5. The method of claim 4, wherein each of the first feed line and the second feed line includes a composite nickel-gold layer on an exposed surface of the probing region.

6. The method of claim 1, further comprising:
providing a first testing signal and a second testing signal from a signal source to the first signal port and the second signal port, respectively, of the at least one antenna device;
acquiring a first output signal and a second output signal from the probe needle set through the first feed line and the second feed line, respectively, of the at least one antenna device; and
determining a first phase difference between a first phase of the first output signal and a second phase of the second output signal.

7. The method of claim 6, wherein the first testing signal and the second testing signal are same signals with a same phase outputted at the signal source.

8. The method of claim 7, further comprising:
in response to the first phase difference, providing the first testing signal and a third testing signal from the signal source; and
causing a second phase difference between the first phase and a third phase of the third testing signal to be substantially equal to a phase error between the first phase difference and 90 degrees.

9. The method of claim 1, wherein the substrate is formed of at least one of glass, fused silica and quartz.

10. The method of claim 1, wherein a stopband range of the shielding structure is determined by a width of the array of conductive pads and a spacing between the array of conductive pads.

11. A probing system for testing at least one antenna device during a testing operation, comprising:
a probe needle set; and
a shielding structure comprising an array of conductive pads configured to cover the at least one antenna device,
wherein each of the at least one antenna device comprises:
a substrate;
a first ground plate arranged in a first layer on a first surface of the substrate;
a first signal port and a second signal port arranged in a second layer adjacent to the first layer;
a first feed line and a second feed line arranged in the second layer and connected to the first signal port and the second signal port, respectively, wherein the first feed line and the second feed line have different line lengths;
a radiation element in a third layer on a second surface of the substrate opposite to the first surface; and
a first slit and a second slit arranged in the first layer and defined by the first ground plate,
wherein the shielding structure is configured to cover the radiation element of the at least one antenna device in the testing operation,
wherein the probe needle set is configured to contact the first feed line and the second feed line in the testing operation.

12. The probing system of claim 11, wherein a signal generator configured to transmit a first testing signal and a second testing signal to the first signal port and the second signal port, respectively, of the at least one antenna device in response to the probe needle set as contacting the first and second feed line and the shielding structure as covering the radiation element of the at least one antenna device,
wherein a signal analyzer is configured to acquire a first output signal and a second output signal from the probe needle set through the first feed line and the second feed line, respectively, of the at least one antenna device in response to the transmitting of the first and second testing signals.

13. The probing system of claim 12, wherein the first feed line and the second feed line are configured to transmit the first and second testing signals, wherein the first and second testing signals are subjected to amplitude calibration or phase calibration in a chip before being transmitted to the first signal port and the second signal port.

14. The probing system of claim 11, wherein each of the first ground plates includes a circular or elliptical shape, and each of the conductive pads includes a rectangular shape.

15. The probing system of claim 11, wherein the radiation element overlaps the first slit and the second slit from a top-view perspective.

16. The probing system of claim 11, wherein each of the antenna devices further includes a second ground plate separating the first ground plate from adjacent antenna devices.

17. The probing system of claim 16, wherein each of the second ground plates has a rectangular shape and electrically connected to one another.

18. The probing system of claim 11, wherein the first slit includes a first primary section allowing a first radio-frequency (RF) signal to transmit to or from the radiation element, and the second slit has a second primary section allowing a second RF signal to transmit to or from the radiation element, the second primary section perpendicular to the first primary section.

19. The probing system of claim 18, wherein at least one of the first slit and the second slit includes a section perpendicular to one of the first primary section and the second primary section.

20. The probing system of claim 11, wherein the first slit and the second slit are separated by the first ground plate.

* * * * *